United States Patent
Statovici (12)

(10) Patent No.: US 6,327,634 B1
(45) Date of Patent: Dec. 4, 2001

(54) SYSTEM AND METHOD FOR COMPRESSING AND DECOMPRESSING CONFIGURATION DATA FOR AN FPGA

(75) Inventor: Mihai G. Statovici, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/139,529

(22) Filed: Aug. 25, 1998

(51) Int. Cl.⁷ ..................................................... G06F 13/38
(52) U.S. Cl. .................................. 710/74; 341/63
(58) Field of Search ..................... 710/23, 68, 1, 710/65, 74; 395/500.17, 500.18; 341/63; 712/300; 713/1

(56) References Cited

U.S. PATENT DOCUMENTS

| | | | |
|---|---|---|---|
| 4,597,057 | * 6/1986 | Snow | 341/60 |
| 4,843,389 | * 6/1989 | Lisle et al. | 341/106 |
| 4,858,101 | * 8/1989 | Stewart et al. | 364/131 |
| 4,864,572 | * 9/1989 | Rechen et al. | 714/701 |
| 5,237,675 | * 8/1993 | Hannon, Jr. | 710/1 |
| 5,430,687 | 7/1995 | Hung et al. | 365/230 |
| 5,499,050 | * 3/1996 | Baldes et al. | 348/180 |
| 5,546,080 | * 8/1996 | Langdon, Jr. et al. | 341/107 |
| 5,563,592 | * 10/1996 | Cliff et al. | 341/63 |
| 5,646,994 | * 7/1997 | Hill | 380/9 |
| 5,789,938 | * 8/1998 | Erickson et al. | 326/40 |
| 5,794,033 | * 8/1998 | Aldebert et al. | 713/100 |
| 5,923,614 | * 7/1999 | Erickson et al. | 365/236 |
| 5,991,515 | * 11/1999 | Fall et al. | 395/114 |

OTHER PUBLICATIONS

"The Programmable Logic Data Book", 1998, pp. 4–5 to 4–69, available from Xilinx, Inc., 2100 Logic Drive, San Jose, CA 95124.

Gilbert Held, "Data Compression: Techniques and Applications: Hardware and Software Considerations, Third Edition", published in 1991 by John Wiley and Sons Ltd., pp. 135–192.

\* cited by examiner

Primary Examiner—Xuan M. Thai
(74) Attorney, Agent, or Firm—Adam H. Tachner; Lois D. Cartier

(57) ABSTRACT

A novel system and method are provided for storing a configuration data file for a programmable logic device such as an FPGA and for loading such a file into the device. The system and method of the present invention improves the performance of a bitstream storage apparatus by compressing the bitstream by a factor of about 5:1 to 10:1 before loading the bitstream into a storage unit, and then decompressing the bitstream, preferably within the storage unit, before forwarding the bitstream to the programmable device. In one embodiment, the decompression circuit is programmable, being able to utilize any of two or more different algorithms. In this embodiment, several different compression algorithms are evaluated, and the most efficient algorithm for that particular bitstream is utilized.

16 Claims, 8 Drawing Sheets

SYSTEM AND METHOD FOR COMPRESSING AND DECOMPRESSING CONFIGURATION DATA FOR AN FPGA

FIELD OF THE INVENTION

The present invention relates generally to the field of configuring a programmable logic device (PLD) such as a Field Programmable Gate Array (FPGA), and more specifically to the efficient storage and downloading of a configuration data file from a memory device to an FPGA.

BACKGROUND OF THE INVENTION

FPGAs are general-purpose programmable devices that are customized by the end users. FPGAs include an array of configurable logic blocks (CLBs) that are programmably interconnected. As shown in FIG. 1, the basic device architecture of an FPGA 100 comprises an array of CLBs embedded in a configurable interconnect structure 103 and surrounded by configurable I/O blocks (IOBs). A CLB and its associated interconnect structure form a tile 108 that is repeated in rows and columns across the FPGA. The configurable interconnect structure 103 allows users to implement multi-level logic designs in which the output signal of one CLB provides input to another CLB, the output of that CLB provides input to another CLB, and so forth. An IOB allows signals to be optionally driven off-chip or brought into the FPGA. The IOB can typically also perform other functions, such as tri-stating outputs and registering incoming or out-going signals.

An FPGA can support tens of thousands of gates of logic operating at system speeds of tens of megahertz. The FPGA is programmed by loading programming data into memory cells (not shown in FIG. 1) controlling the CLBs, IOBs, and interconnect structure 103. One type of FPGA is the XC4000™ family of devices from Xilinx, Inc. Further information about the XC4000 family of FPGAs appears on pages 4–5 to 4–69 of "The Programmable Logic Data Book 1998", published in 1998 and available from Xilinx, Inc. at 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

Each CLB in the FPGA can include configuration memory cells (not shown in FIG. 1) for controlling the functions performed by that CLB. For example, a typical CLB may include several programmable lookup tables, multiplexers, and memory elements. A lookup table stores a truth table that implements the combinational logic function corresponding to the truth table. The multiplexer is a special-case one-directional routing structure that is controlled by one or more configuration memory cells. The memory elements may, for example, be programmable as flip-flops or latches. The configuration memory cells control the functionality of each of these elements and the interconnections between these elements within the CLB.

Interconnect structure 103 includes programmable interconnect points (PIPs, not shown in FIG. 1) that control the interconnection of wiring segments in the programmable interconnect network of FPGA 100. Each PIP may, for example, be a pass transistor controlled by a configuration memory cell. Wire segments on each side of the pass transistor are either connected or not connected together, depending on whether the transistor is turned on by the corresponding configuration memory cell.

Configuration is the process of loading a bitstream (configuration data file) containing the program data into the configuration memory cells that control the CLBs, IOBs, and interconnect structure of the FPGA. (Other structures in the FPGA may also be configured by the bitstream, e.g., global clock buffers and phase-locked loops.) The bitstream is typically stored in an external memory device 106 such as programmable read-only memory (PROM). The bitstream is loaded into the FPGA through a configuration loading circuit 104. (For clarity, configuration loading circuit 104 is shown in FIG. 1 as external to the CLB and IOB array 102. However, loading circuit 104 may be implemented as a block of logic located within array 102, or may be distributed throughout array 102.) The bitstream is often loaded into the FPGA serially to minimize the number of pins required for configuration and to reduce the complexity of the interface to external memory. The bitstream is broken into packets of data called frames. As each frame is received, it is shifted through a frame register until the frame register is filled. The data in the frame register of the FPGA are then loaded in parallel into one row or column of configuration memory cells. Following the loading of the first frame, subsequent frames of bitstream data are shifted into the FPGA, and another row or column of configuration memory cells is designated to be loaded with a frame of bitstream data. One configuration circuit is described in detail by Hung et al in U.S. Pat. No. 5,430,687, issued Jul. 4, 1995, entitled "Programmable Logic Device Including a Parallel Input Device for Loading Memory Cells", which is incorporated herein by reference.

The step of loading the bitstream into the FPGA limits the speed of configuration. This "bitstream bottleneck" has become increasingly apparent as the number of configuration bits has increased over the past several years from thousands to tens and hundreds of thousands, even millions, of bits. This dramatic increase in bitstream size has resulted in a corresponding increase in the time required for configuration and reconfiguration. Therefore, what is needed is a system and method for efficiently loading bitstream data into an FPGA for rapid configuration and reconfiguration of the configuration memory cells.

Very large bitstreams can cause other problems, as well. For example, PROMs are limited in their storage capacity. To store a single bitstream for the largest FPGAs available today, several PROMs may be required, increasing system costs and using excessive space on the printed circuit board on which the PROMs are typically mounted. This problem is exacerbated when several different bitstreams are provided for the FPGA. Therefore, it is desirable to provide a system and method for reducing the amount of space needed to store an FPGA bitstream.

Cliff et al describe one such system and method in U.S. Pat. No. 5,563,592, issued Oct. 8, 1996 and entitled "Programmable Logic Device Having a Compressed Configuration File and Associated Decompression", which is incorporated herein by reference. Applying the method described by Cliff et al to FPGA 100 of FIG. 1 results in the system shown in FIG. 2. First, the bitstream is compressed on a computer (not shown). The compressed bitstream is then loaded into external memory device 206 via memory input bus 212. (In other systems described by Cliff et al, the bitstream is compressed via a compression circuit included in memory device 206.) Memory device 206 includes a memory array 210, in which the compressed bitstream is stored, and a decompression circuit 208. The bitstream is decompressed by decompression circuit 208, and the decompressed bitstream is loaded into FPGA 100.

In another system also described by Cliff et al, the decompression circuit is included in the FPGA. This modification allows the final step of transmitting the bitstream to the FPGA to be performed on a decompressed bitstream, thereby reducing the amount of time necessary for the transmittal. This system is applied to the FPGA of FIG. 1 as shown in FIG. 3. In FIG. 3, FPGA 300 comprises CLB and IOB array 102, loading circuit 104, and decompression circuit 208.

Although overcoming to some extent the problems previously described, Cliff et al state that their system and method permits "a ratio of as much as 2 to 1", i.e., the compressed bitstream is at least half the size of the original bitstream. It is desirable to provide a system and method for compressing and decompressing FPGA configuration data that gives a higher compression ratio, with the corresponding benefits of reduced storage requirements and faster transfer of configuration data.

SUMMARY OF THE INVENTION

The present invention provides a novel system and method for storing a configuration data file for a programmable logic device such as an FPGA and for loading such a file into the device. The system and method of the present invention improves the performance of a bitstream storage apparatus by compressing the bitstream by a factor of usually about 5:1 to 10:1 (and in some cases even more) before loading the bitstream into a storage unit, and then decompressing the bitstream, preferably within the storage unit, before forwarding the bitstream to the programmable device.

According to the method of the invention, a compression "alphabet" is provided, comprising bit sequences of various lengths. A bitstream to be compressed is statistically analyzed to determine the most frequently-used bit sequences. These most frequently-used bit sequences are assigned the shortest "alphabet sequences". Less frequently-used bit sequences are assigned longer alphabet sequences. Several different algorithms providing this type of compression are well known.

In one embodiment, several different algorithms are tested by the computer program performing the statistical analysis, and the most efficient algorithm for that particular bitstream is utilized.

Once a bitstream has been compressed, it is stored in a memory device such as a PROM. In order to decompress the bitstream, however, the assigned alphabet (and the assigned algorithm, if more than one algorithm is available) must be available to the decompression circuit. In one embodiment, this information is stored in the PROM memory array along with the compressed bitstream. In another embodiment, several alphabets are predefined and implemented in hardware as part of the decompression circuit. In this embodiment, only a few bits need be stored in the PROM, to select one of the available alphabets.

The decompression circuit may be included in the PROM, in the FPGA itself, or as a separate circuit.

According to another aspect of the invention, any data stream can be evaluated based on a plurality of compression algorithms, and the most effective algorithm used. A bit sequence is then applied to a programmable decompression circuit, identifying the selected algorithm. The data stream is decompressed based on the selected algorithm. This more general system and method can be applied, for example, to a voice synthesis device or a display device.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

There are three primary characteristics of programmable logic devices and the method and system of the present invention that make them especially compatible with one another.

First, the method of the invention provides unexpectedly efficient compression ratios for configuration data files. An FPGA bitstream (or a similar configuration data file for another programmable or reprogrammable logic device) generally has a better compression ratio (that is, a higher ratio of file size before compression to file size after compression) than a text file or file of random bits compressed using the same algorithm. This characteristic results partly from the regular "frame-based" structure of the bitstream and partly from the inclusion of large numbers of "default bits" for default configurations in the FPGA, resulting in large strings of consecutive binary "1"s or "0"s. Therefore, a memory device with a relatively small size can store a compressed bitstream with a much larger original size. Storing and accessing compressed files also increases storage throughput and access speed, since writing a compressed file is faster than writing the same file in its original format. Clearly, the more efficient the compression and decompression algorithm used, the greater the benefit gained by using this method.

Tests conducted by the assignee of the present invention have shown that commonly available statistical compression algorithms (e.g., the Lempel-Ziv, or "ZIP" compression algorithm) can offer a compression ratio of more than 90% for a configuration bitstream. Because the ZIP algorithm scans a data file for the longest repetitive sequences of bits, even higher compression ratios can be achieved as bitstreams increase in size.

Second, a characteristic of the algorithms used in practicing the method of the invention ensures that while much more efficient than prior art methods, the method of the invention is not correspondingly more expensive. Although the compression algorithms used are complex, decompression algorithms are usually much simpler than their corresponding compression algorithms. The complex compression step, while it can be implemented in expensive hardware if desired, is preferably implemented in a computer using well known software that is available at no charge (e.g., ZIP software). Only the relatively simple decompression step is performed in hardware, either in an external memory device, a dedicated circuit, or the FPGA to be configured.

Third, an FPGA bitstream need be compressed only once, however many times it will be utilized. The complexity of a selected compressing algorithm need not, therefore, unduly slow the speed of loading the data file to a storage device. As such, a suitable compression algorithm can be selected to maximize the compression ratio based on the bit pattern of the configuration bitstream at issue, without overwhelming concern for the complexity of the compression task.

FLOWCHART ILLUSTRATING THE INVENTION

Figure 1:
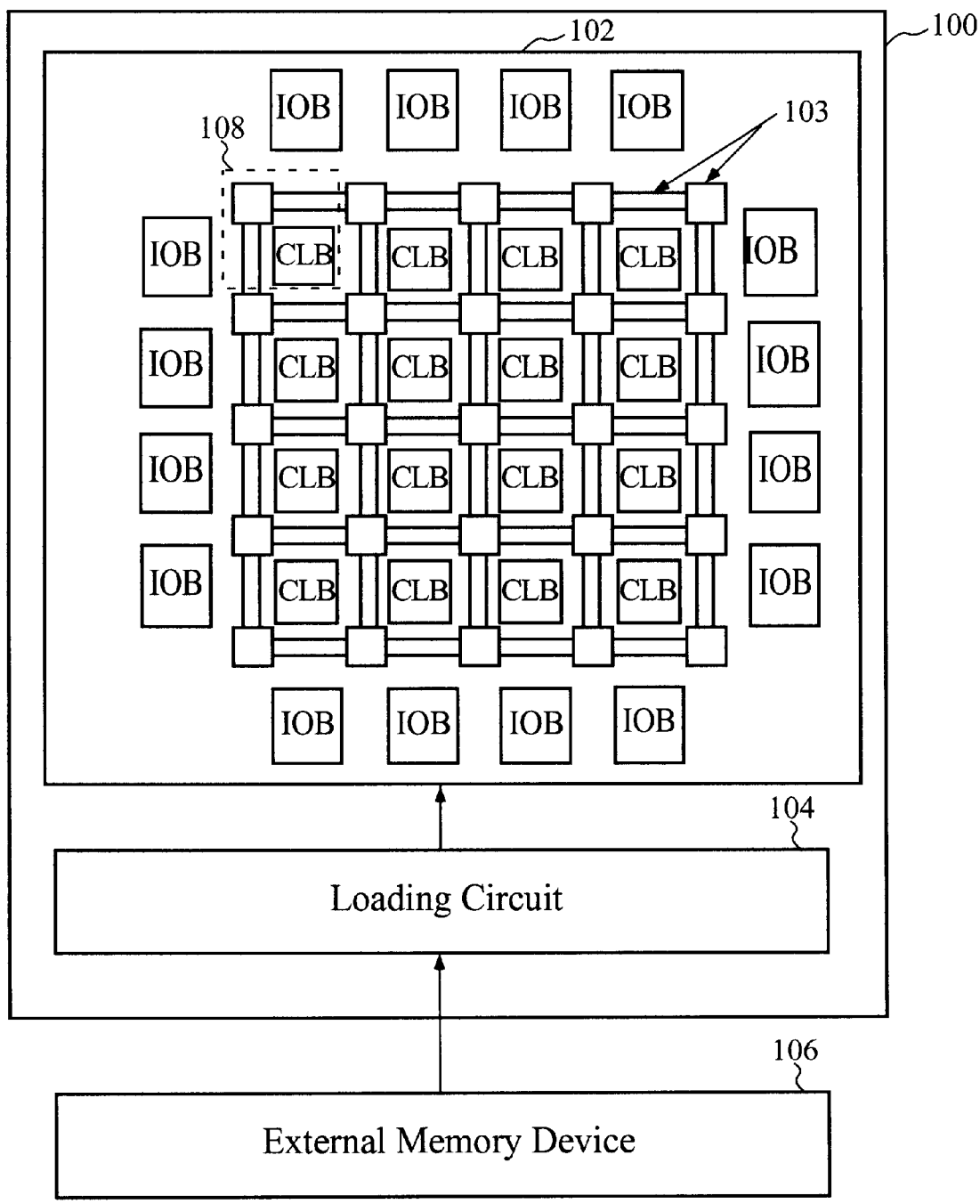
FIG. 1 illustrates a field programmable gate array (FPGA) and external memory device in accordance with the available art.
Figure 2:
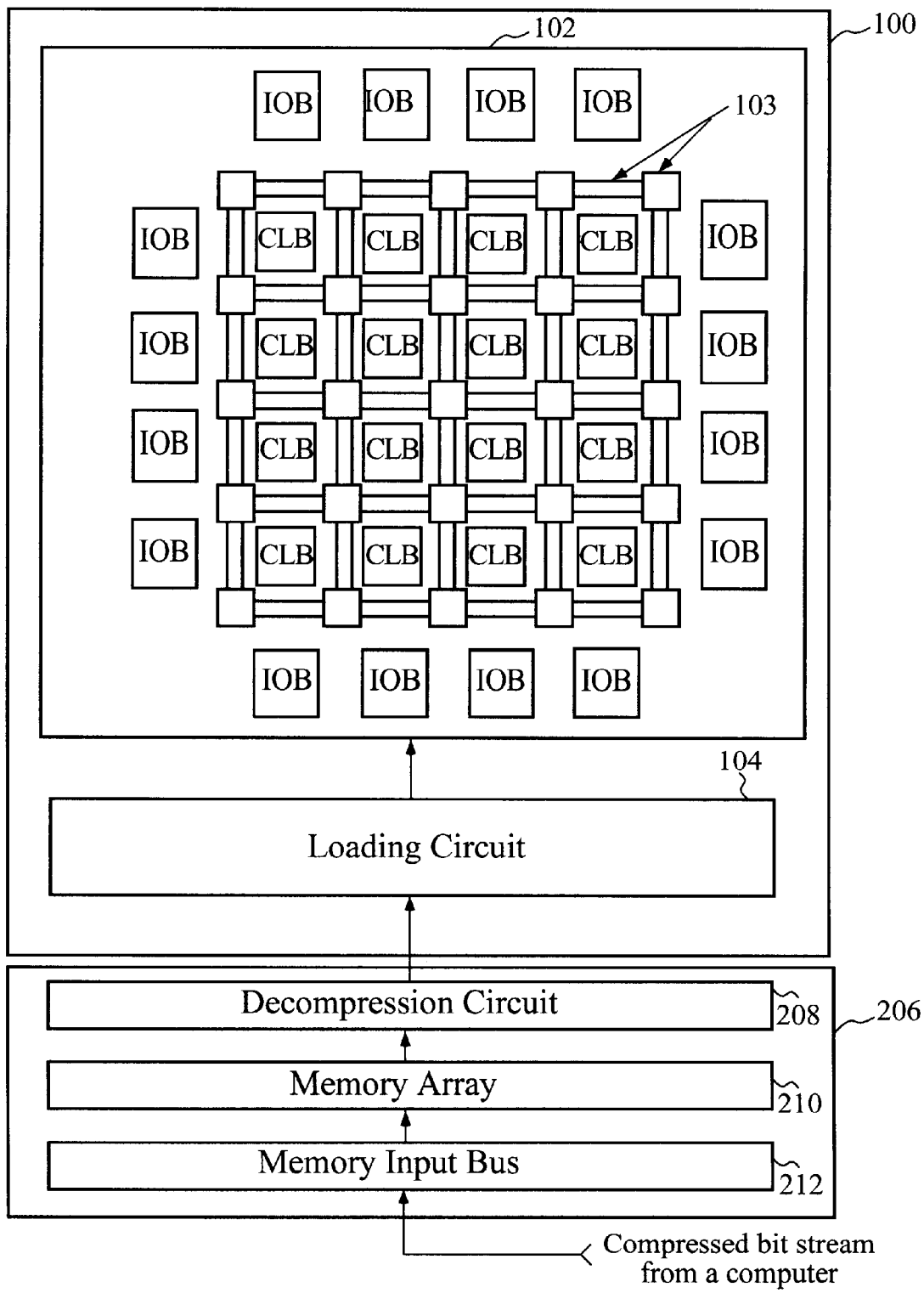
FIG. 2 illustrates a first prior art system for loading a compressed configuration bitstream to an FPGA.
Figure 3:
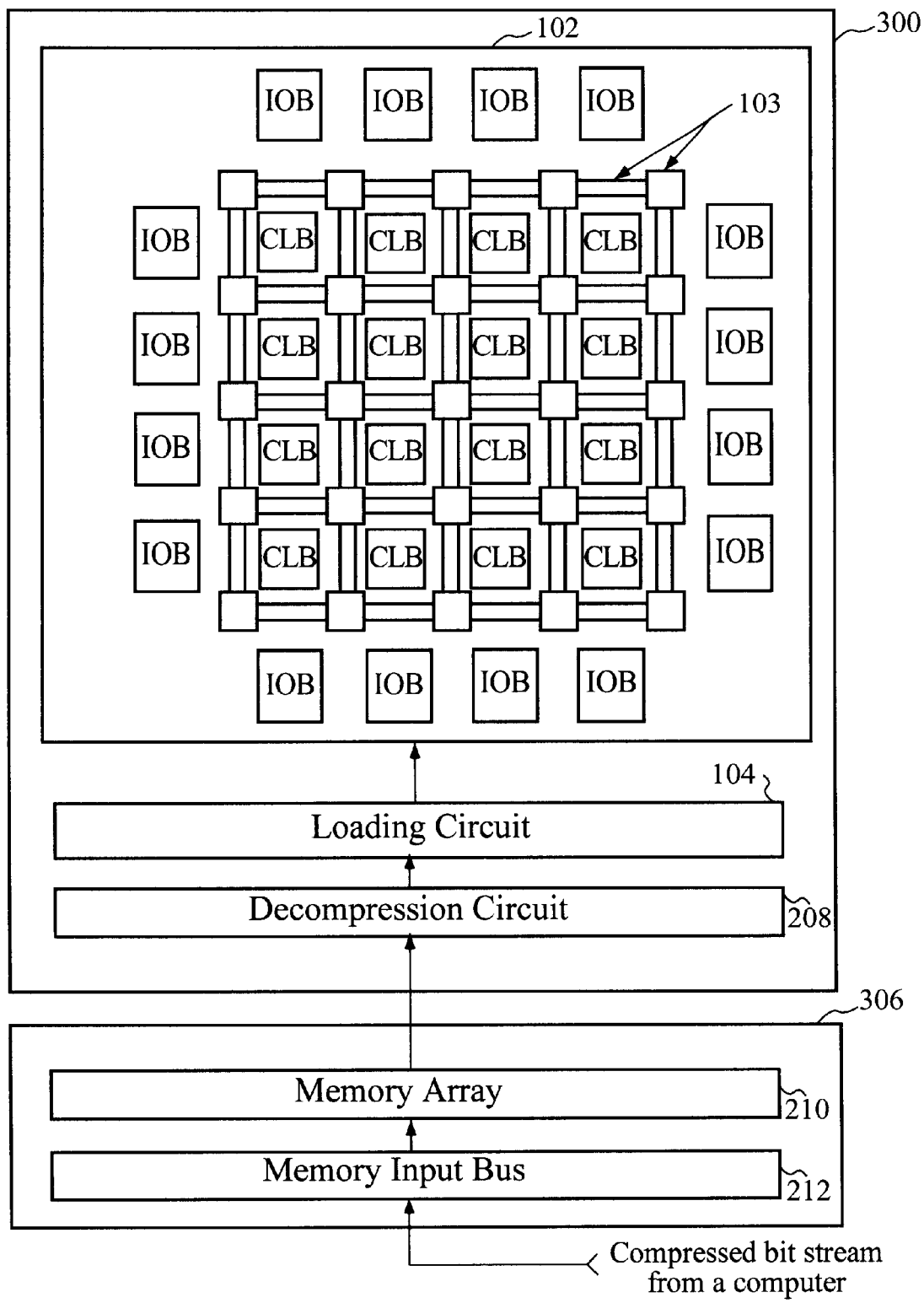
FIG. 3 illustrates a second prior art system for loading a compressed configuration bitstream to an FPGA.
Figure 4:
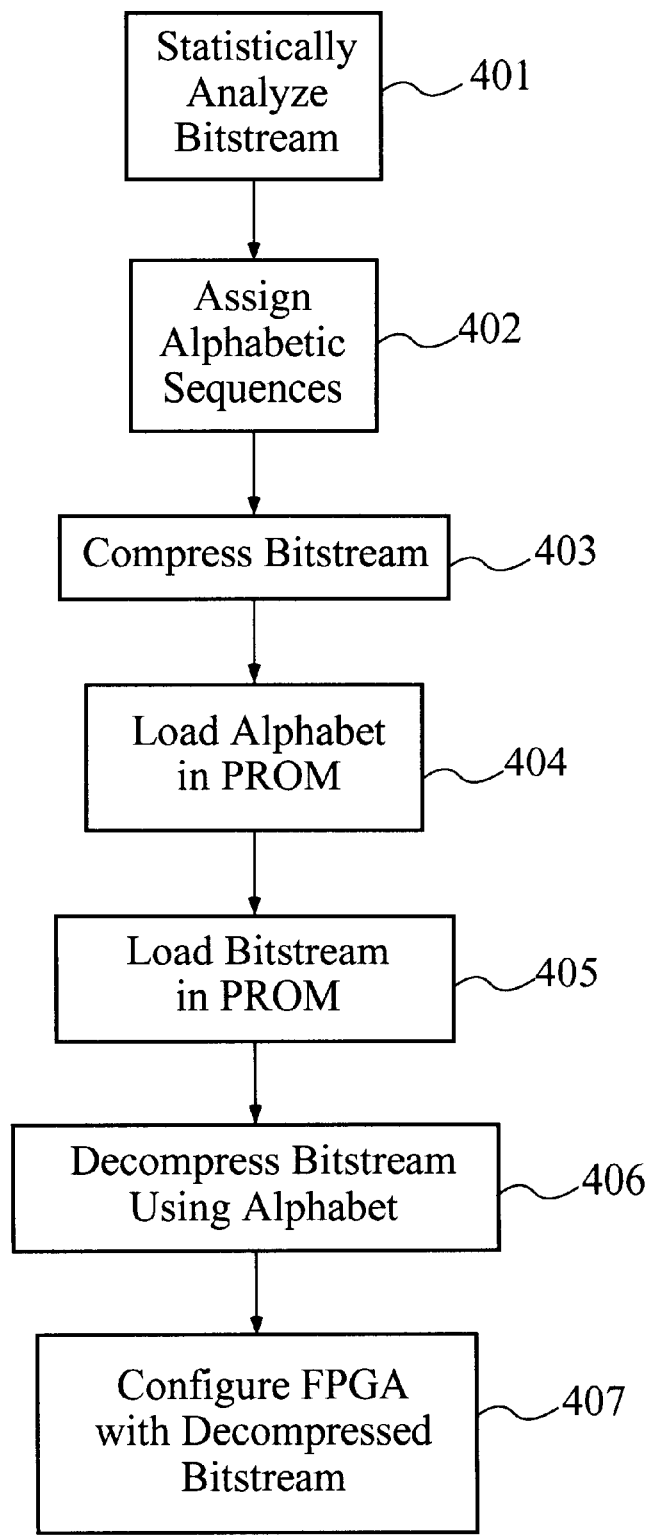
FIG. 4 is a flowchart illustrating an embodiment of the method of the present invention.

FIG. 4 is a flowchart illustrating the method of the invention according to a preferred embodiment. At step 401, a configuration bitstream is statistically analyzed by a computer to determine the most frequently occurring bit sequences. A compression "alphabet" is selected, comprising bit sequences (alphabetic sequences) of various lengths. The alphabetic sequences are unique and no two sequences share the same initial sequence of bits, e.g., the sequences "001" and "0010" are not included in the same alphabet. (This property of non-duplication allows the decompression circuit to "decode" an alphabetic sequence as soon as the sequence matches one of the stored alphabetic sequences, greatly simplifying the decompression circuitry.) An alphabet typically includes 32 or 64 different codes. This statistical analysis technique is described by Gilbert Held on pages 135 to 141 of "Data Compression: Techniques and Applications: Hardware and Software Considerations, Third Edition", published in 1991 by John Wiley and Sons Ltd., which pages are incorporated herein by reference.

In some embodiments, step 401 also includes the testing of several different compression algorithms, and the selection of one algorithm providing the best compression ratio for this particular bitstream.

At step 402, the alphabetic sequences are assigned to the recurring bit sequences from the bitstream, the most frequently-used bit sequences being assigned the shortest alphabetic sequences. For example, a string of 16 bits that occurs frequently may be replaced by an alphabetic sequence of three bits. On the other hand, a sequence of four bits that occurs only rarely may be replaced by an alphabetic sequence of eight bits. Other bit sequences, such as non-recurring bit sequences, are not compressed. These "non-compressed" sequences are preceded by a special alphabetic sequence that indicates, for example, "the next four bits are in clear". The alphabetic sequences are assigned in such a fashion as to result in the shortest overall compressed bitstream.

At step 403, the recurring bit sequences from the bitstream are replaced by the corresponding alphabetic sequences and the compressed bitstream is generated.

Steps 401–403 may be performed by a commercially available compression software program using, for example, the well-known ZIP compression algorithm. Other well-known algorithms that can be used in the method of the invention include Huffman compression, Shannon-Fano coding, arithmetic coding, and substitutional compressors such as LZ78 and LZ77. These and other statistical compression algorithms are described by Gilbert Held on pages 141 to 192 of "Data Compression: Techniques and Applications: Hardware and Software Considerations, Third Edition", published in 1991 by John Wiley and Sons Ltd., which pages are incorporated herein by reference.

At step 404, the alphabet is stored in an external memory such as a PROM. In another embodiment, a code bit sequence is stored in the PROM, the code bit sequence selecting one of a set of previously determined alphabets. These predetermined alphabets may be previously stored in the PROM or implemented in hardware. In yet another embodiment, a co de bit sequence indicates which of several predetermined algorithms was used to compress the bitstream.

At step 405, the compressed bitstream is stored in the PROM. (In some embodiments, steps 404 and 405 are reversed.) At step 406, a decompression circuit reads the compressed bitstream from the PROM using the designated alphabet and/or algorithm. The decompression circuit may be included in the PROM, in the FPGA itself, or as a separate circuit. At step 407, the decompressed bitstream is transmitted to a loading circuit that configures the target FPGA.

Observed Test Results

Figure 5:
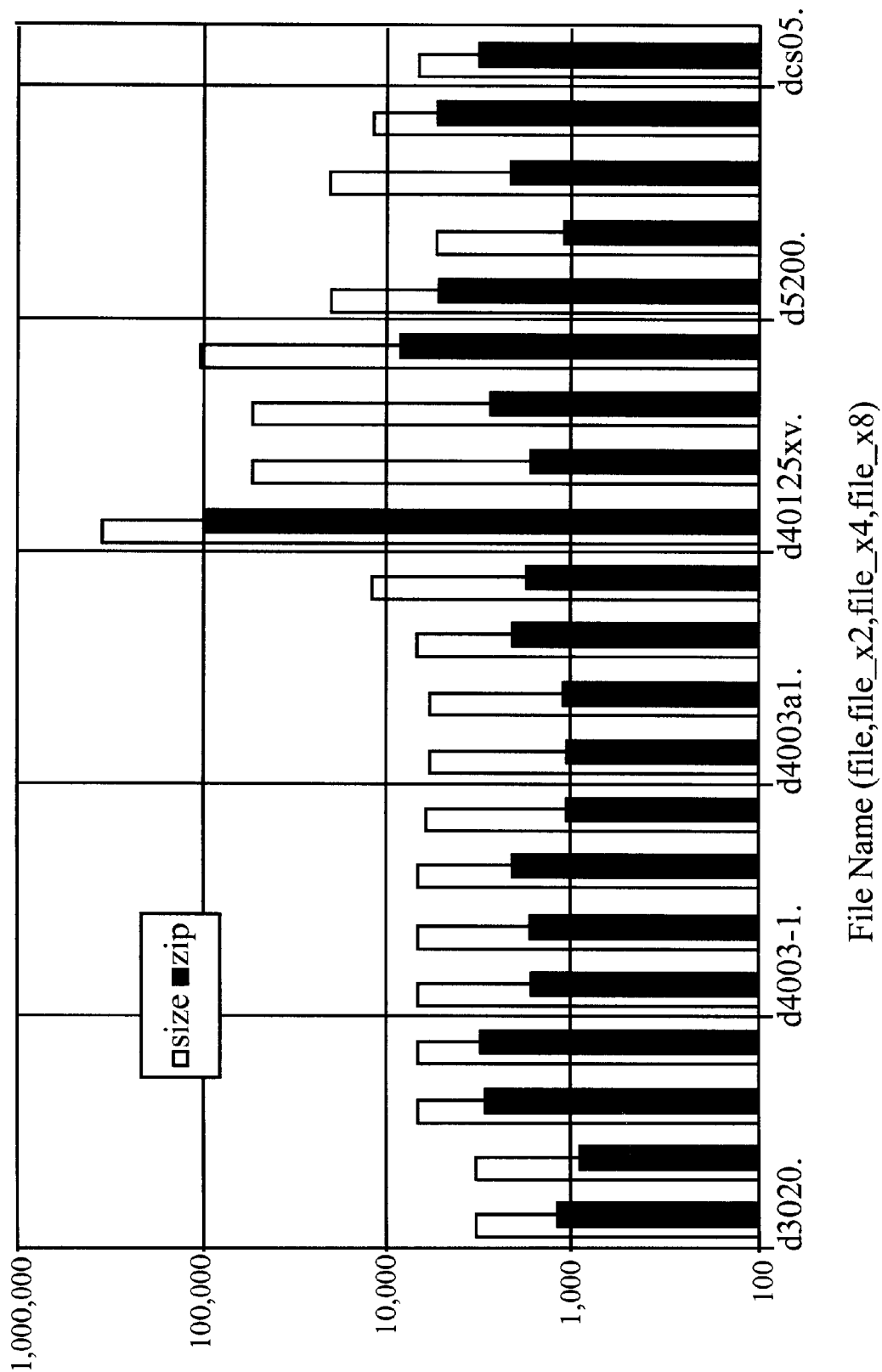
FIG. 5 is a chart comparing the sizes of original and compressed configuration bitstreams. The sizes are expressed on a logarithmic scale.

FIG. 5 illustrates the results of compressing a set of bitstreams created by the assignee of the present invention, using the ZIP compression algorithm. The horizontal axis indicates the names of configuration bitstreams, and the vertical axis indicates the sizes of the bitstreams in bytes. The white bars indicate the sizes of the bitstreams before compression (and after decompression), and the corresponding black bars indicate the sizes of the corresponding compressed bitstreams. Note that the vertical scale is logarithmic.

Figure 6:
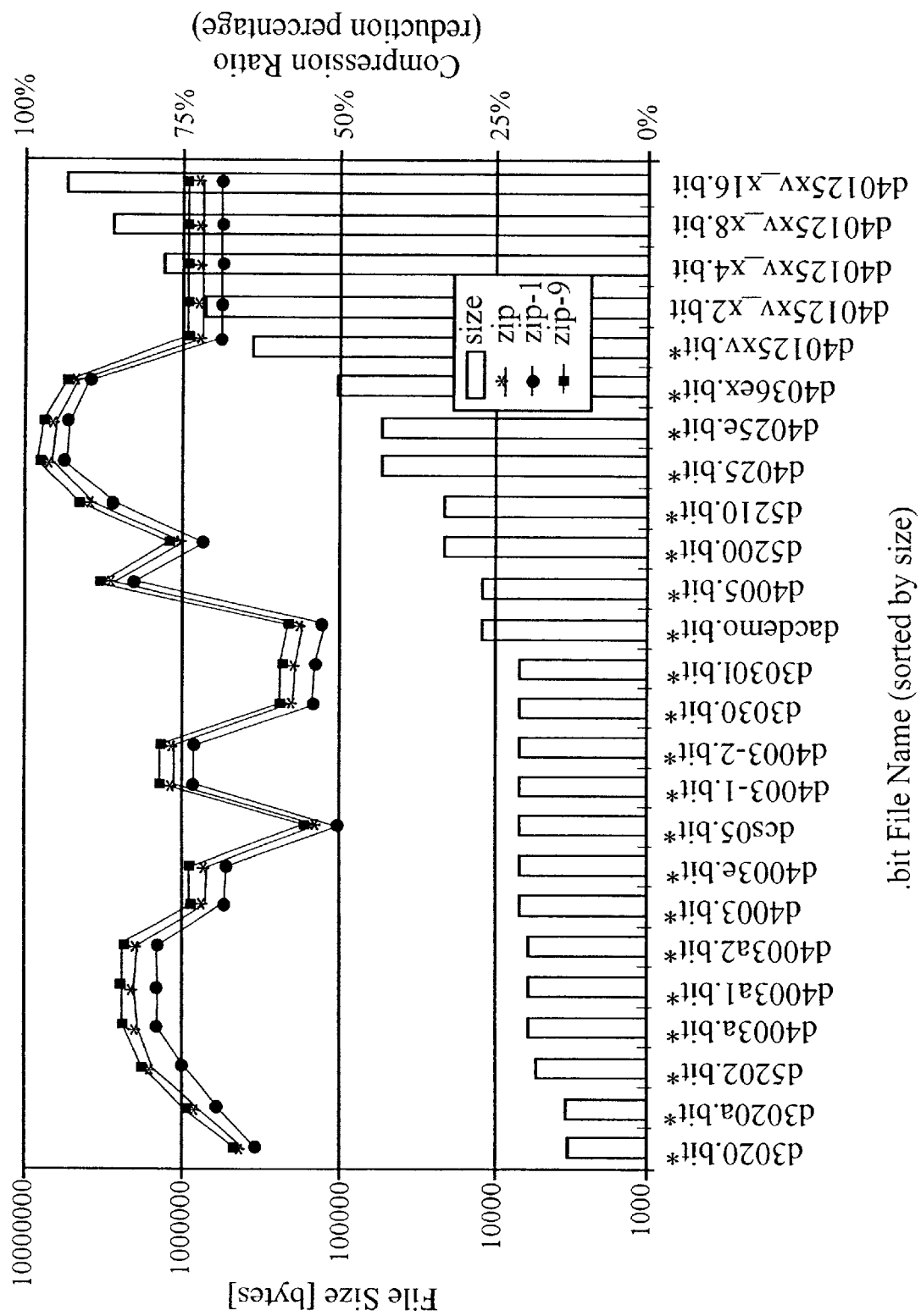
FIG. 6 is a data compression chart showing the compression ratios (expressed as a percentage) for demonstration bitstreams of various sizes using the method of the invention.

FIG. 6 illustrates a set of observed results on another set of demonstration bitstreams. Results are shown using three versions of the ZIP compression algorithm: common ZIP (also referred to herein simply as "ZIP"); fast ZIP (ZIP-1), and best ZIP (ZIP-9). Specifically, the common ZIP algorithm is represented by crosses (x), the ZIP-1 algorithm by round dots, and the ZIP-9 algorithm by squares. The horizontal axis indicates configuration bitstreams created by the assignee of the present invention. The vertical axis on the left indicates original file sizes for the bitstreams in bytes. Each of the bitstreams is represented by a white bar, and the bitstreams are arranged by increasing size from the left to the right. The vertical axis on the right indicates the compression ratio, expressed in this figure as a percentage calculated by dividing the difference between the original file size and the compressed file size by the original file size. For example, the bitstream d4036ex.bit is reduced by 90% of its original size by the ZIP-1 algorithm.

Figure 7:
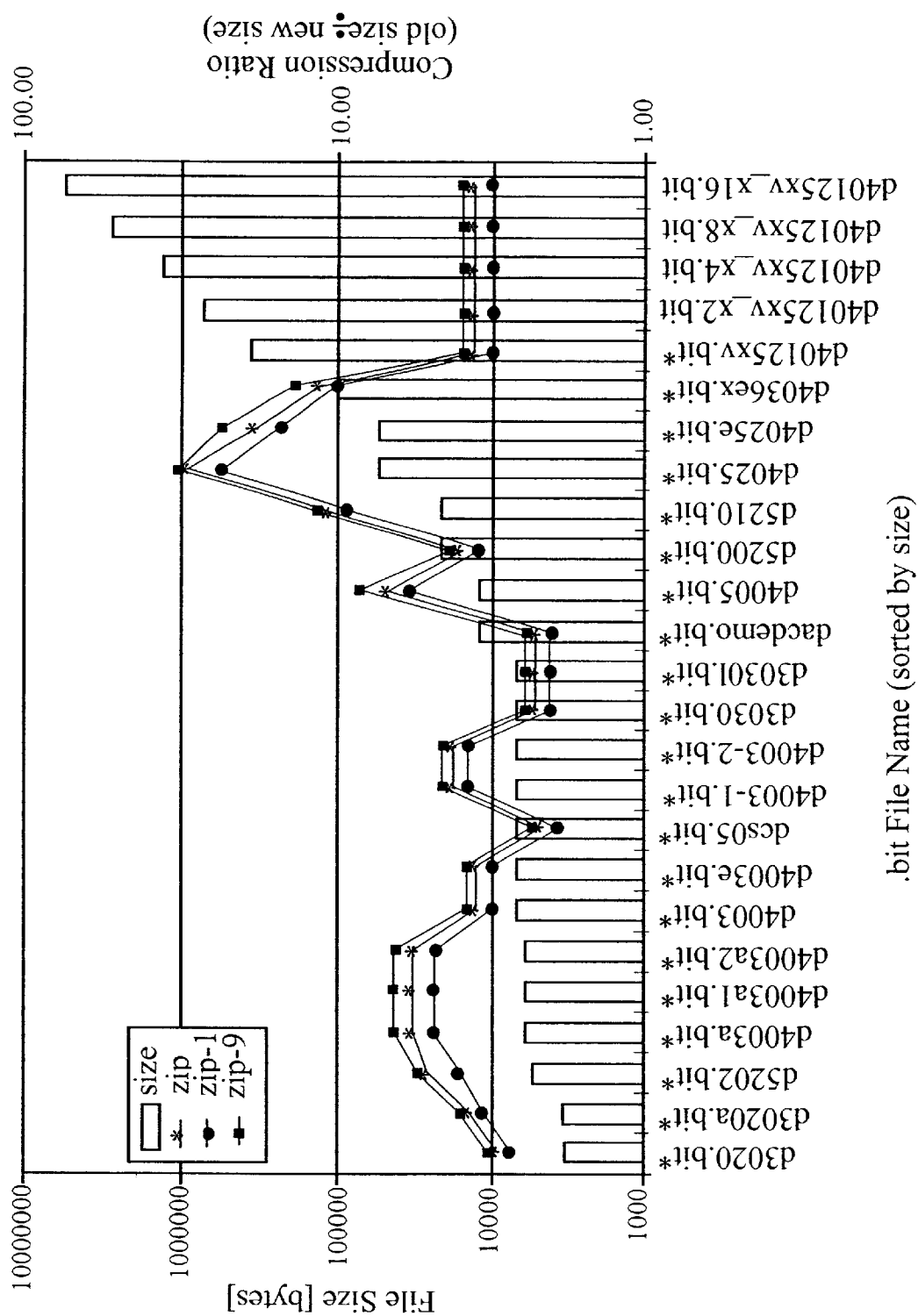
FIG. 7 is a data compression chart showing the compression ratios (expressed on a logarithmic scale) for the demonstration bitstreams of FIG. 6.

FIG. 7 illustrates the same observed results and the same notations as those used in FIG. 6, except that the vertical axis on the right indicates the compression ratio as a number on a logarithmic scale, rather than as a percentage. For example, the bitstream d4036ex.bit is compressed by a factor of 10 by the ZIP-1 algorithm.

Figure 8:
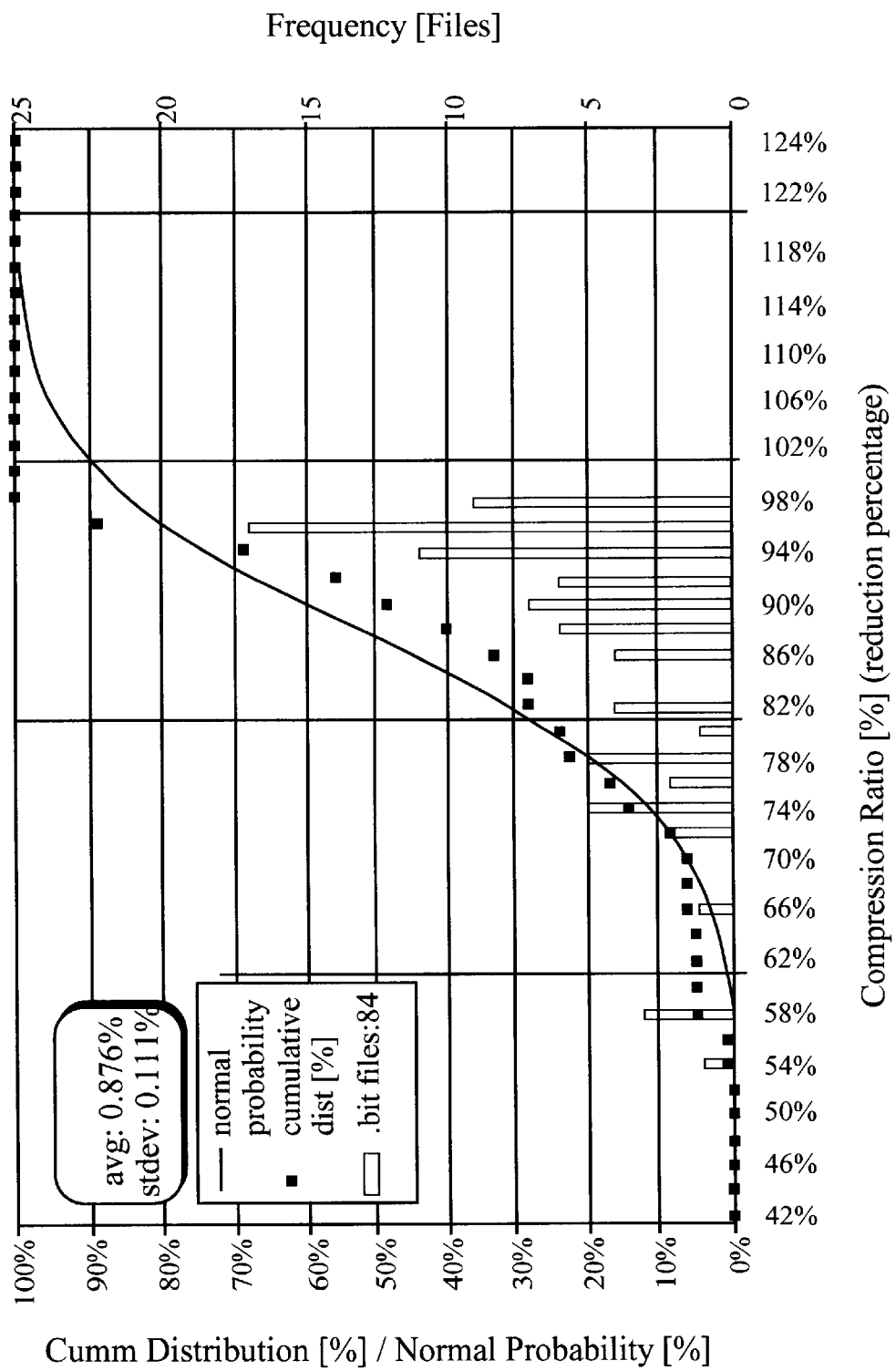
FIG. 8 is a frequency graph summarizing compression results obtained using the method of the invention on a different set of 84 demonstration bitstreams.

FIG. 8 is a histogram (or frequency graph) summarizing the compression results of 84 different configuration bitstreams created by the assignee of the present invention. The numbers along the horizontal axis indicate the compression ratio for the bitstreams (expressed as a reduction ratio, e.g., a number of 74% means that the compressed file is 26% the size of the original file). The vertical white bars, along with the frequency numbers on the right, indicate the number of bitstreams that showed the corresponding compression ratio. For example, five bitstreams showed a compression ratio of 74%.

The square dots, along with the numbers on the left, show the percentage of bitstreams that have achieved the corresponding compression ratio or a lesser ratio. For example, about 40% of the bitstreams achieved a compression ratio of 88% or less. Put another way, about 60% of the bitstreams achieved greater than 88% compression. Note also that 65 of 84 bitstreams (over 75%) are compressed by at least 80%.

The smooth curve is calculated with a normal distribution formula using the experimental data represented by the square dots.

As shown in FIGS. 5–8, the ZIP compression algorithm provides more favorable compression ratios for configuration bitstreams than were previously available, thus allowing an external memory device with a relatively small size to store a compressed data file with a much larger original size.

Wider Applications for the Invention

The method of the invention can also be advantageously applied to any situation where: 1) a stream of data (bits, bytes, words, etc.) is compressed more efficiently using some compression algorithms than others; 2) the data is first compressed, then stored in a memory device; and 3) each time the device is activated, the stream of data is sequentially read from the memory device and loaded into another device. For example, the system and method of the present invention could be used in a voice synthesis device using digital-to-analog conversion to generate a voice-based data stream that is sequentially read from a PROM or a disk file. Also, the invention could be used for a display device that repeatedly displays a piece of information on its display panel based on a data stream that is sequentially read from a ROM or a disk file. In both situations, performance of the systems can be improved by compressing the data stream using the most efficient available algorithm before storing the data stream into the ROM or disk file and decompressing the data stream before loading it to the destination device.

Those having skill in the relevant arts of the invention will now perceive various modifications and additions which may be made as a result of the disclosure herein. For example, the above text primarily describes the invention in the context of FPGAs. However, the invention can also be applied to other programmable logic devices, or to other systems not involving programmable logic. Although the ZIP algorithm is used in the sample results, other algorithms can also be used with the system and method of the invention. Moreover, the decompression circuitry utilized could take any one of myriad forms yet to be determined. Accordingly, all such modifications and additions are deemed to be within the scope of the invention, which is to be limited only by the appended claims and their equivalents.

What is claimed is:

1. A method for providing a configuration data file to a programmable logic device (PLD), the method comprising:
   statistically analyzing the configuration data file and generating a plurality of recurring bit sequences, each recurring bit sequence including low and high values in a different sequence;
   assigning alphabetic sequences to the recurring bit sequences;
   compressing the configuration data file by substituting the alphabetic sequences for the recurring bit sequences, thereby generating a compressed data file;
   loading the compressed data file into a memory device; and
   decompressing the compressed data file by substituting the recurring bit sequences for the alphabetic sequences,
   wherein the memory device comprises a plurality of stored alphabets, each alphabet comprising a plurality of alphabetic sequences, and the method further comprises:
   loading a code sequence into the memory device, the code sequence indicating one of the plurality of stored alphabets, the indicated one of the plurality of stored alphabets comprising the alphabetic sequences assigned in the step of assigning alphabetic sequences.

2. The method of claim 1, further comprising:
   loading the alphabetic sequences into the memory device.

3. The method of claim 1, further comprising:
   configuring the PLD with the decompressed data file.

4. The method of claim 1, wherein the memory device comprises a decompression circuit that performs the step of decompressing the compressed data file.

5. The method of claim 1, wherein the PLD is a Field Programmable Gate Array (FPGA).

6. The method of claim 1, wherein the memory device is a Programmable Read Only Memory (PROM).

7. A method for providing a configuration data file to a programmable logic device (PLD), the method comprising:
   statistically analyzing the configuration data file and generating a plurality of recurring bits sequences, each recurring bit sequence including low and high values in a different sequence;
   assigning alphabetic sequences to the recurring bit sequences;
   compressing the configuration data file by substituting the alphabetic sequences for the recurring bit sequences, thereby generating a compressed data file;
   loading the compressed data file into a memory device; and
   decompressing the compressed data file by substituting the recurring bit sequences for the alphabetic sequences,
   wherein statistically analyzing the configuration data file and generating a plurality of recurring bit sequences comprises:
   a1) evaluating the configuration data file based on a first compression algorithm;
   a2) evaluating the configuration data file based on a second compression algorithm; and
   a3) selecting one of the first and second compression algorithms, based on the results of steps a1) and a2).

8. The method of claim 7, wherein the memory device comprises a decompression circuit capable of implementing first and second decompression algorithms, and the method further comprises:
   loading a code sequence into the memory device, the code sequence indicating one of the first and second decompression algorithms.

9. An apparatus for providing a configuration data file to a programmable logic device (PLD), comprising:
   a computer device including:
   computer readable program code for statistically analyzing the configuration data file and generating a plurality of recurring bit sequences, each recurring bit sequence including low and high values in a different sequence;
   computer readable program code for assigning alphabetic sequences to the recurring bit sequences; and
   computer readable program code for compressing the configuration data file by substituting the alphabetic sequences for the recurring bit sequences, thereby generating a compressed data file;

a memory array coupled to receive the compressed data file from the computer device; and a decompression circuit coupled to receive the compressed data file from the memory array and coupled to provide a decompressed data file to the PLD, wherein the memory array comprises a plurality of stored alphabets, each alphabet comprising a plurality of alphabetic sequences, the apparatus further comprising:

means for loading a code sequence into the memory array, the code sequence indicating one of the plurality of stored alphabets.

10. The apparatus of claim 9, further comprising:

means for loading the alphabetic sequences into the memory array.

11. The apparatus of claim 9, further comprising:

means for configuring the PLD with the decompressed data file.

12. The apparatus of claim 9, wherein the memory array and the decompression circuit are integral parts of a single integrated circuit device.

13. The apparatus of claim 9, wherein the PLD is a Field Programmable Gate Array (FPGA).

14. The apparatus of claim 9, wherein the memory array is a Programmable Read Only Memory (PROM).

15. An apparatus for providing a configuration data file to a programmable logic device (PLD), comprising:

a computer device including:

computer readable program code for statistically analyzing the configuration data file and generating a plurality of recurring bit sequences, each recurring bit sequence including low and low values in a different sequence;

computer readable program code for assigning alphabetic sequences to the recurring bit sequences; and computer readable program code for configuration data file by substituting the alphabetic sequences for the recurring bit sequences, thereby generating a compressed data file;

a memory array coupled to receive the compressed data file from the computer device; and a decompression circuit coupled to receive the compressed data file from the memory array and coupled to provide a decompressed data file to the PLD, wherein the computer device further comprises:

computer readable program code for evaluating the configuration data file based on a first compression algorithm;

computer readable program code for evaluating the configuration data file based on a second compression algorithm; and computer readable program code for selecting one of the first and second compression algorithms.

16. The apparatus of claim 15, wherein the memory array comprises a decompression circuit capable of implementing first and second decompression algorithms, the apparatus further comprising:

means for loading a code sequence into the memory array, the code sequence indicating one of the first and second decompression algorithms.

* * * * *